United States Patent
Dias (10) Patent No.: US 7,280,061 B2
(45) Date of Patent: Oct. 9, 2007

(54) DIGITAL-TO-ANALOG CONVERTER USING A FREQUENCY HOPPING CLOCK GENERATOR

(75) Inventor: Victor Dias, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/127,738

(22) Filed: May 12, 2005

(65) Prior Publication Data

US 2005/0270193 A1    Dec. 8, 2005

(30) Foreign Application Priority Data

May 18, 2004  (DE)  ...................... 10 2004 024 645

(51) Int. Cl.
*H03M 1/66* (2006.01)
*H03M 3/00* (2006.01)

(52) U.S. Cl. ...................................... 341/144; 341/143

(58) Field of Classification Search ................. 341/144, 341/61, 71, 145, 143, 147; 324/76.79; 327/105–107, 327/129; 331/4; 375/132, 134, 140, 329, 375/376, 219, 232, 296; 340/10.1; 365/219; 380/34; 455/79; 708/276, 313, 270–273
See application file for complete search history.

(56) References Cited

U.S. PATENT DOCUMENTS

| | | | | |
|---|---|---|---|---|
| 4,740,995 A | * | 4/1988 | Schevin et al. | 375/296 |
| 4,901,265 A | * | 2/1990 | Kerr et al. | 708/276 |
| 4,998,108 A | * | 3/1991 | Ginthner et al. | 341/145 |
| 5,319,801 A | * | 6/1994 | Richey et al. | 455/79 |
| 5,440,636 A | * | 8/1995 | Herrick | 380/34 |
| 5,457,456 A | * | 10/1995 | Norsworthy | 341/61 |
| 5,489,903 A | | 2/1996 | Wilson et al. | 341/144 |
| 5,500,874 A | * | 3/1996 | Terrell | 375/232 |
| 5,521,533 A | * | 5/1996 | Swanke | 327/107 |
| 5,537,434 A | | 7/1996 | Persson et al. | 375/134 |
| 5,786,778 A | * | 7/1998 | Adams et al. | 341/61 |
| 6,169,761 B1 | * | 1/2001 | Marcoccia et al. | 375/132 |
| 6,191,991 B1 | * | 2/2001 | Wada | 365/219 |
| 6,252,464 B1 | * | 6/2001 | Richards et al. | 331/4 |

(Continued)

OTHER PUBLICATIONS

"Modern Communications and Spread Spectrum", George R. Cooper and Clare D. McGillem, McGraw-Hill International Editions, 1986, 4 pgs. no month.
"Multirate Digital Signal Processing", Ronald E. Crochiere and Lawrence R. Rabiner, Prentice-Hall Inc., 1983, 12 pgs. no month.
"Digital Signal Processing—Principles, Algorithms, and Applications", John G. Proakis and Dimitris G. Manolakis, Prentice Hall, 1996, 5 pgs. no month.
"Digital Signal Processing—Principles, Algorithms, and Applications", John G. Proakis and Dimitris G. Manolakis, Prentice Hall, 1996, 14 pgs. no month.

*Primary Examiner*—Howard L. Williams
(74) *Attorney, Agent, or Firm*—Eschweiler & Associates, LLC (57) ABSTRACT

Method and device for reducing the signal images at the output of a digital/analog converter. In a method for reducing the signal images at the output of a digital/analog converter, a frequency hopping clock generator provides a digital data signal whose data rate is varied according to a frequency hopping method. The digital data signal is converted into an analog signal by a digital/analog converter, the conversion clock being varied according to the frequency hopping method.

12 Claims, 5 Drawing Sheets

U.S. PATENT DOCUMENTS

| | | | |
|---|---|---|---|
| 6,356,124 B1 * | 3/2002 | Schoch | 327/129 |
| 6,396,890 B1 * | 5/2002 | Turner | 375/376 |
| 6,424,282 B1 | 7/2002 | Maenza | 341/144 |
| 6,539,064 B1 * | 3/2003 | Ellis et al. | 375/296 |
| 6,563,862 B1 * | 5/2003 | Knutson et al. | 375/219 |
| 6,633,226 B1 * | 10/2003 | Nysen | 340/10.1 |
| 6,693,980 B1 * | 2/2004 | Linder et al. | 375/329 |
| 6,731,101 B2 * | 5/2004 | Miyagawa et al. | 324/76.79 |
| 6,778,106 B2 * | 8/2004 | Lenez et al. | 341/61 |
| 6,809,669 B1 * | 10/2004 | Robinson | 341/131 |
| 6,865,216 B1 * | 3/2005 | Beamish et al. | 375/140 |
| 6,933,866 B1 * | 8/2005 | Weitz | 341/71 |
| 2003/0160637 A1 | 8/2003 | Ho | |
| 2005/0085194 A1 * | 4/2005 | Robinson et al. | 455/91 |

* cited by examiner

DIGITAL-TO-ANALOG CONVERTER USING A FREQUENCY HOPPING CLOCK GENERATOR

REFERENCE TO RELATED APPLICATIONS

This application claims the benefit of the priority date of German application DE 10 2004 024 645.9, filed on May 18, 2004, the contents of which are herein incorporated by reference in their entirety.

FIELD OF THE INVENTION

The invention relates to a method and a device for reducing the signal images at the output of a digital/analog converter.

BACKGROUND OF THE INVENTION

Figure 1:
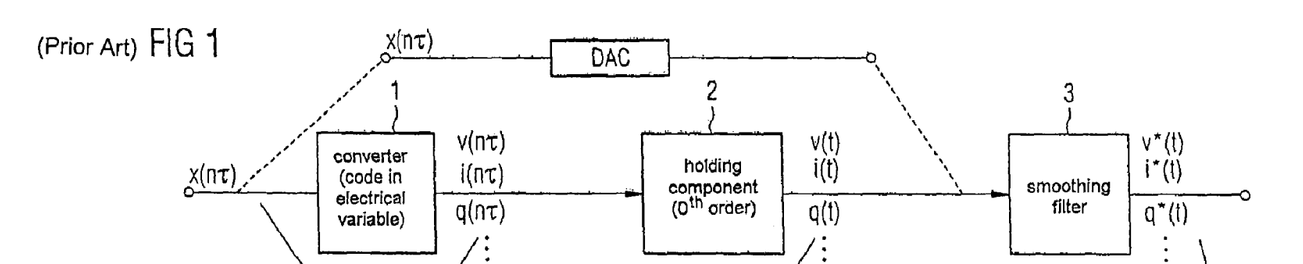
FIG. 1 shows an outline representation of a digital/analog converter with a downstream smoothing filter.

A synchronous digital/analog converter (DAC) may be regarded according to FIG. 1 as a circuit which consists of a converter 1 and a holding component 2. This DAC circuit simultaneously implements the following two operations:

converting a number $x(n\tau)$ into an electrical variable, for example voltage $v(n\tau)$, current $i(n\tau)$ or charge $q(n\tau)$. The number $x(n\tau)$ is usually represented in a binary code. The quantity $\tau$ denotes the sampling period, and n denotes the discrete time.

keeping the electrical variable constant over a time interval which corresponds to the sampling period $\tau$ or a fraction thereof. The $0^{th}$ order holding component 2 is used for this. The electrical variable $v(t)$, $i(t)$ or $q(t)$ is provided in a continuous time form at the output of the holding component 2.

Figures 2A, 2B, 2C, 3A, 3B, 3C:
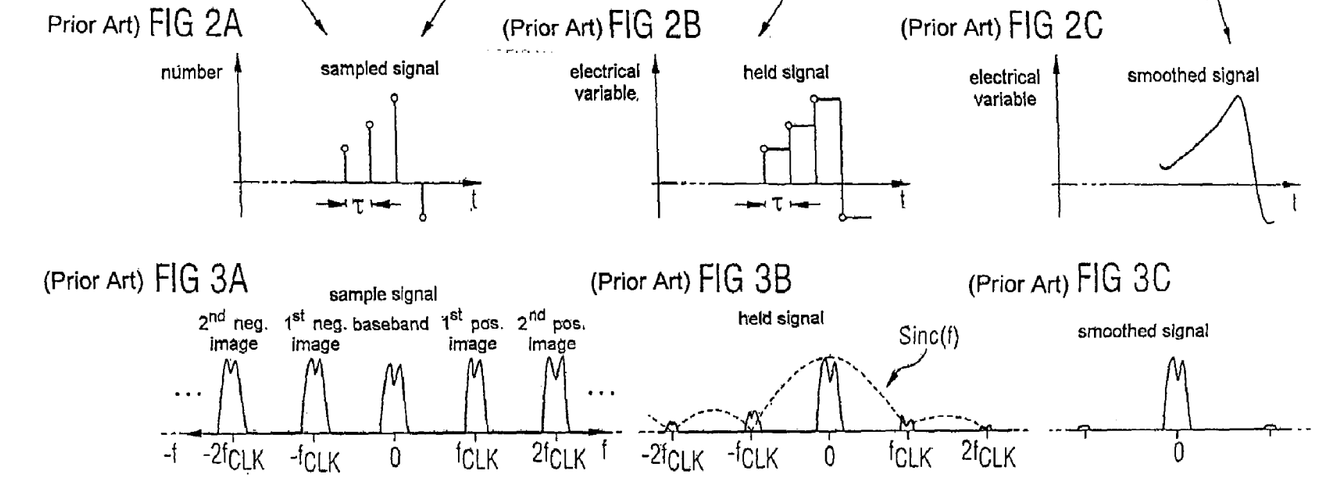
FIG. 2A shows a representation of the sampled signal in the time domain.
FIG. 2B shows a representation of the held signal in the time domain.
FIG. 2C shows a representation of the smoothed signal in the time domain.
FIG. 3A shows a representation of the sampled signal in the frequency domain.
FIG. 3B shows a representation of the held signal in the frequency domain.
FIG. 3C shows a representation of the smoothed signal in the frequency domain.

FIG. 2A shows a synchronous digital signal in the time domain, i.e. the number $x(n\tau)$ plotted against time t. The digital signal can be represented as a sequence of Dirac functions. The sampling period $\tau$ corresponds to the inverse of the clock frequency $f_{CLK}$, i.e. $1/f_{CLK}$. In the frequency domain (FIG. 3A), the digital signal is formed by an infinite number of repetitions of the signal spectrum around positive and negative multiples of the clock frequency, $k \cdot f_{CLK}$, $k=0$, $\pm 1$, $\pm 2$, . . . . As usual, the frequency band at d.c. (k=0) is referred to as the baseband and the other frequency bands are referred to as sidebands or signal "images".

In mathematical terms, the conversion of a number into an electrical variable is merely a change of variables, which does not cause any change in the signal spectrum. There are discrete time sample values ($x(n\tau)$ and $v(n\tau)$, $i(n\tau)$, $q(n\tau)$) before and after the conversion.

In contrast to this, the holding operation (holding component 2) transforms the signal from the discrete time domain into the continuous time domain, i.e. it changes the nature of the signal. The signal $v(t)$, $i(t)$ or $q(t)$ exists as a sequence of levels in the time domain (FIG. 2B), whereas it is filtered according to the function $\sin(\pi f/f_{CLK})/(\pi f/f_{CLK})$ in the frequency domain, see FIG. 3B. This function is conventionally referred to as the sinc function. This "free" filtering attenuates mainly the signal images of the signal since, apart from the baseband, they take the value zero at all multiples of the clock frequency $f_{CLK}$. The attenuation achieved for the signal images is essentially a function of the ratio between the clock frequency $f_{CLK}$ and the bandwidth $f_B$ of the signal, i.e. $f_{CLK}/f_B$. Large values of the ratio $f_{CLK}/f_B$ cause high attenuation of the signal images which, for a given fixed signal bandwidth $f_B$, necessitates high clock rates. Large values of the ratio $f_{CLK}/f_B$ also mean an increase in the flatness of the frequency excursion in the baseband.

Since a digital/analog converter is typically intended to generate the signal without the signal images, a filter 3 is conventionally required so as to attenuate the signal images to a particular required amplitude. The filter is often referred to as an anti-image filter, (AIF) post filter, reconstruction filter, smoothing filter, etc. The filtered signal $v^*(t)$, $i^*(t)$ or $q^*(t)$ at the output of the filter 3 is represented in the time domain (FIG. 2C) and in the frequency domain (FIG. 3C).

For example, a clock frequency $f_{CLK}=13$ MHz and a signal bandwidth $f_B=100$ kHz ensures "free" attenuation of 44 dB at the lower edge of the first signal image. At the baseband edge, the flatness of the signal is about $8.45 \cdot 10^{-4}$ dB. With an additional filter 3, it is possible to achieve higher attenuations and flatnesses.

Primarily two approaches have to date been adopted so as to achieve high attenuation of the signal images. The first option is to increase the ratio $f_{CLK}/f_B$ and therefore raise the "free" sinc(f) attenuation. In industrial applications, values of the ratio $f_{CLK}/f_B$ on the order of several hundred are customary. A disadvantage is the high power use and the great requirement for chip area entailed by an increase in the clock rate. A second option is to use continuous time smoothing filters 3, the order of which is given by a balance between the intended attenuation at the first signal image, the frequency flatness in the baseband and the implementation technology (tuned or untuned). Again, significant costs are incurred with respect to the power consumption, the chip area and the development of such circuits.

At least theoretically, an alternative to the aforementioned options consists in implementing a higher-order holding function at the output of the digital/analog converter. Instead of keeping the electrical variable constant over the clock period $\tau$ (keeping the electrical variable constant is referred to as zeroth-order holding), the electrical variable is selected so that it takes information about the preceding values into account when determining the current value (this corresponds precisely to the mode of operation of a filter). It can be shown that higher-order holding components 2 produce higher-order $sinc^k(f)$ functions with $k=2, 3, \ldots$ This concept, however, is very difficult to implement in practice.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides a method and a device which make it possible to suppress or attenuate the signal images at the output of a digital/analog converter.

In accordance with an aspect of the present invention, a method for reducing the signal images at the output of a digital/analog converter comprises providing a digital data signal, the data rate of which is varied according to a frequency sequence of a frequency hopping method, and converting the digital data signal into an analog signal, the conversion clock being varied according to the frequency sequence.

The frequency hopping method is a known technique, which is commonly used in telecommunications systems. It is characterized by a carrier frequency of the transmitter changing ("hopping") periodically in the time domain. The frequency changes are given by a frequency sequence $f_1$, $f_2$, $f_3$, .... The receiver knows the frequency sequence and is constantly tuned to the current carrier frequency of the transmitter in accordance with the sequence. The frequency hopping method allows low-perturbation signal transmission, since interference in one of the frequency channels impairs the transmission quality only briefly because of the rapid frequency change. The frequency hopping method furthermore guarantees a high degree of data security, since external receivers do not know the frequency sequence and can therefore be tuned to the transmitter only rarely or briefly.

The mode of operation of the method according to the invention consists in distributing or spreading the power of the first signal image over a broader bandwidth because of the periodically changing data rate and clock frequency. The attenuation of the first signal image is therefore increased in comparison with the case without a frequency hopping method (i.e., with a data rate and clock frequency constant over time). The additional attenuation which can be achieved by the method according to the invention is generally dependent on the ratio of the bandwidths which are occupied by the signal images in the case without a frequency hopping method and in the case with a frequency hopping method.

One advantage of the method according to the invention is that the smoothing filter may either be entirely obviated or may have a lower order.

A first configuration of the method according to the invention is characterized in that the data rate of a predetermined digital input data signal is varied according to the frequency hopping method by means of a data rate converter when providing a data signal. Methods for changing the data rate of a signal are known in the technology of digital multirate signal processing, see for example the book "Digital Signal Processing", J. G. Proakis et al., Prentice Hall, 1996, pages 790-792. The data rate variation is preferably carried out by interpolation and decimation.

Another option is to generate the digital data signal with a varying data rate by means of a signal generator. In this case, it is not necessary to carry out data rate conversion of an incoming external input data signal, since the data rate varying according to the invention is already taken into account in the signal generation.

In this case, an advantageous variant of the method is characterized in that the signal generation is carried out by reading data words from a memory with a reading clock dictated by the frequency sequence and an addressing rule selected as a function of the current reading clock.

In accordance with another aspect of the invention, a device according to the invention for reducing the signal images at the output of a digital/analog converter comprises a frequency hopping clock generator, which generates a clock signal with a clock frequency varying according to a frequency sequence of a frequency hopping method. The device furthermore contains a means driven by the frequency hopping clock generator for providing a digital data signal with a data rate corresponding to the clock signal, and a digital/analog converter clocked by the clock signal for converting the digital data signal into an analog signal.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

The invention will be explained in more detail below with the aid of exemplary embodiments, with reference to the drawings in which.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale.

Figure 4:
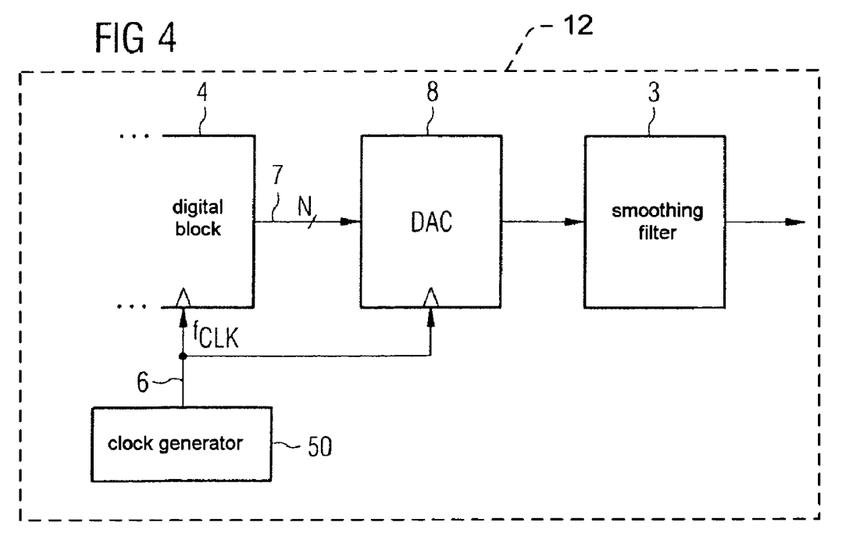
FIG. 4 shows a block diagram of a digital/analog converter with a downstream smoothing filter according to the prior art.

According to FIG. 4, a digital block 4 is driven by a clock generator 5 which emits a clock signal 6 with a fixed clock frequency $f_{CLK}$, wherein the digital block 4 and clock generator 5 may be included in a receiver 12. The digital block 4 delivers digital data words (word width N) via a data connection 7 to a digital/analog converter 8. The data rate is $f_{CLK}$, i.e. it corresponds to the clock frequency of the clock signal.

The clock signal 6 furthermore drives the clock input of the digital/analog converter 8. The mode of operation of the digital/analog converter 8 and of the downstream smoothing filter 3 have already been described in relation to FIGS. 1-3C.

Figure 5:
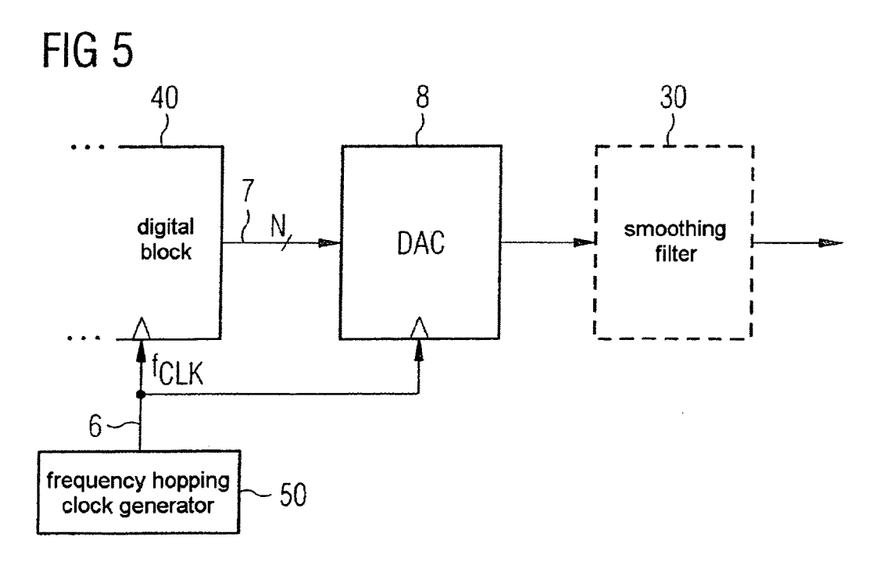
FIG. 5 shows a block diagram of a digital/analog converter according to the invention with an optional smoothing filter.

FIG. 5 shows an exemplary embodiment of a device according to the invention. Components which are the same or functionally equivalent as in the previous figures are denoted by the same references. The digital block 40 is driven by a frequency hopping clock generator 50, which is likewise connected to the clock input of the digital/analog converter 8. The clock frequency $f_{CLK}$ is given by a frequency sequence $f_1$, $f_2$, $f_3$, ... The digital block 40 allows data rate conversion of the digital signal delivered via the data connection 7, according to the clock signal 6 which is received.

The mode of operation of the device represented in FIG. 5 will be explained below with reference to an example:

For the signal bandwidth $f_B$ and the reference clock frequency $f_{CLK}$, the values $f_B$=100 kHz and $f_{CLK}$~=13 MHz will be assumed.

The digital block 40 furthermore makes it possible to generate a data rate of 12.8 MHz and 13.2 MHz. To this end, the frequency hopping clock generator 50 generates the clock frequency $f_{CLK}$=13 MHz for one third of the time, the clock frequency $f_{CLK}$=13.2 MHz for another third of the time and the clock frequency $f_{CLK}$=12.8 MHz for the remaining third of the time. This causes the following:

the baseband signal always remains within the frequency interval $[-f_B, f_B]$, regardless of the clock frequency at which the data are converted by the digital/analog converter 8.

the power of the first image of the signal lies around 12.8 MHz for ⅓ of the time, around 13 MHz for another ⅓ of the time and around 13.2 MHz for the remaining ⅓ of the time. The power contained in the first signal image is therefore distributed over a broader bandwidth, so that additional attenuation is achieved at each frequency compared with the case without a frequency hopping method (i.e. with a fixed clock frequency $f_{CLK}$). The power reduction in this simple example is −4.8 dB.

In practice, a larger number of alternative frequencies should be taken into account. In particular, it is possible to provide a pseudo-random frequency sequence, such as code division communications systems, with frequency hopping.

Figure 6:
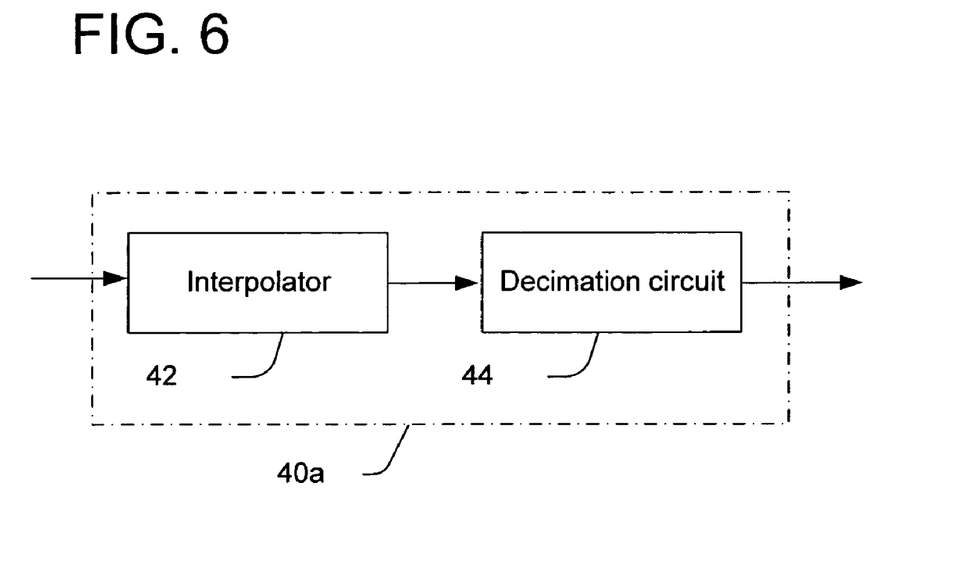
FIG. 6 shows a data rate converter with a series circuit of an interpolator and a decimating circuit.

There are various ways in which the digital block 40 may be produced. A first option is for the digital block 40 to be a data rate converter 40a as shown in FIG. 6. In this case, the data rate converter 40a is provided with an input data signal which has its data rate varied according to the clock signal 6. For example, the data rate converter 40a may be constructed from a series circuit of an interpolator 42 (which increases the data rate by a particular factor) and a decimation circuit 44 (which decreases the data rate by a particular factor). For example, FIR filters or polyphase filters may be used for the interpolation. The decimation may likewise be carried out by a polyphase filter. Further information can be found on pages 792-803 of the textbook by J. G. Proakis cited in the introduction, which are hereby incorporated into the content of the present document by reference.

Figure 7:
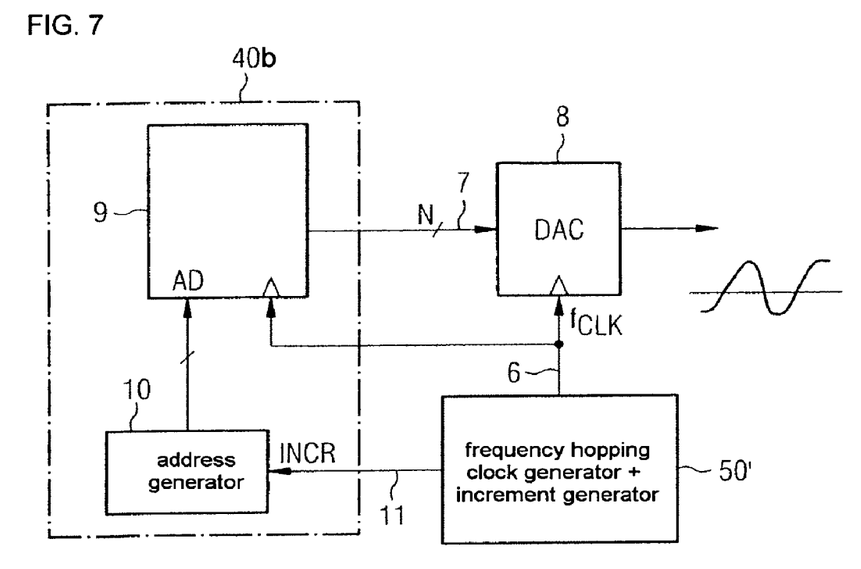
FIG. 7 shows a sine generator for generating an analog sine signal.

Another option is for the digital block 40 to represent a digital generator 40b, which may also be referred to as a signal generator or sine function generator in one or more embodiments, see FIG. 7. The signal generator 40b comprises, for example, a memory 9 with a memory chip capacity D of, for example, D=1024 data words with a word width of N bits. Each data word contains a sample value of a sine function, which is sampled with a phase increment of $2\pi/1024$ rad. The memory 9 is thus loaded with a full period of a sine function. It is also possible to load the memory 9 merely with sample values relating to ¼ of the period of the sine function, in which case the symmetry of the sine function with respect to the period quarters is exploited.

Instead of a sine function, of course, it is also possible for the memory 9 to store the sample values of other periodic functions, or even non-periodic functions defined over an infinite definition.

An address input AD of the memory 9 is driven via an address generator 10. The address generator 10 is connected via a control data connection 11 to a frequency hopping clock generator 50'. The latter differs from the frequency hopping clock generator 50 of FIG. 5 in that it furthermore contains an increment generator. The rest of the circuit structure corresponds to the representation in FIG. 5.

If the data words of the memory 9 are read at a clock frequency $f_{CLK}$=1 MHz with an address increment INCR=1 (the address increment INCR is communicated from the increment generator to the address generator 10 via the control data line 11, and indicates the difference between two successive address values), then approximately one thousand clock periods are needed in order to read a full sine period from the memory 9. This means that a frequency $f_{GEN}$ of about 1 kHz is generated. The following applies $$f_{GEN} = \frac{1}{D} f_{CLK} \cdot INCR.$$

For a given memory capacity D, the address increment INCR and/or the clock frequency $f_{CLK}$ can be used to synthesize other signal frequencies $f_{GEN}$. For the example of a signal generator with a constant frequency $f_{GEN}$ as described here, the product $f_{CLK} \cdot INCR$ has to be kept constant. For example, the following frequency hopping scheme may be carried out:

If $f_{CLK}$=1 MHz and INCR=10, a frequency $f_{GEN}$=10 kHz will be generated, and the first signal images lie at 990 kHz and 1010 kHz.

If INCR=11 and $f_{CLK}$=10/11 MHz (≈909 kHz), a frequency $f_{GEN}$=10 kHz will likewise be generated, but the first signal images now lie at approximately 899 kHz and 919 kHz.

If INCR=9 and $f_{CLK}$=10/9 MHz (≈1,111 kHz), a frequency $f_{GEN}$=10 kHz will likewise be generated, although the first signal images now lie at approximately 1101 kHz and 1121 kHz.

If the value pairs ($f_{CLK}$, INCR) are selected from a set of P alternatives, and the frequency hopping sequence $f_{CLK}$=$f_1$, $f_2$, $f_3$, ... $f_P$ is a pseudo-random sequence, then each signal image of the generated signal will be distributed over P pitches, each pitch having an average power of 1/P.

It is clear that in all practical applications, the number P of different frequencies involved in the frequency hopping method may be substantially more than 3.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method for digital-to-analog conversion, comprising:
providing a digital data signal, wherein the data rate of the digital signal is varied according to a frequency sequence of a frequency hopping method; and
converting the digital data signal into an analog signal employing a conversion clock being varied according to the frequency sequence,
wherein the data rate variation is carried out by interpolation and decimation.

2. The method of claim 1, wherein the frequency sequence is a pseudo-random sequence.

3. The method of claim 1, wherein the digital data signal is a baseband signal.

4. The method of claim 1, wherein the interpolation is accomplished by FIR filtering.

5. The method of claim 1, wherein the interpolation is accomplished by polyphase filtering.

6. The method of claim 1, wherein the decimation is accomplished by polyphase filtering.

7. A system for digital-to-analog conversion, comprising:
a frequency hopping clock generator, which generates a clock signal with a clock frequency varying according to a frequency sequence of a frequency hopping method;
a digital block driven by the frequency hopping clock generator for providing a digital data signal with a data rate corresponding to the clock signal; and
a digital/analog converter clocked by the clock signal for converting the digital data signal into an analog signal, wherein
signal images formed by multiples of the frequency of the clock signal around a center frequency of the digital data signal are reduced,
wherein the digital block is a digital rate converter, which varies the data rate of a predetermined digital input data signal according to the clock signal,
wherein the digital rate converter comprises a series circuit having at least an interpolator and a decimator circuit.

8. The system of claim 7, wherein the frequency sequence is a pseudo-random sequence.

9. The system of claim 7, wherein the digital data signal is a baseband signal.

10. The system of claim 7, wherein the interpolator is an FIR filter.

11. The system of claim 7, wherein the interpolator is a polyphase filter.

12. The system of claim 7, wherein the decimator circuit is a polyphase filter.

* * * * *

UNITED STATES PATENT AND TRADEMARK OFFICE
CERTIFICATE OF CORRECTION

| | | |
|---|---|---|
| PATENT NO. | : 7,280,061 B2 | Page 1 of 1 |
| APPLICATION NO. | : 11/127738 | |
| DATED | : October 9, 2007 | |
| INVENTOR(S) | : Victor Dias | |

It is certified that error appears in the above-identified patent and that said Letters Patent is hereby corrected as shown below:

Column 2, line 10: Please replace the word "(FIG. 20)" with --(FIG. 2C)--

Column 2, line 10: Please replace the word "(FIG. 30)" with --(FIG. 3C)--

Signed and Sealed this

Fourth Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 7,280,061 B2  Page 1 of 1
APPLICATION NO. : 11/127738
DATED : October 9, 2007
INVENTOR(S) : Victor Dias It is certified that error appears in the above-identified patent and that said Letters Patent is hereby corrected as shown below:

Column 2, line 10: Please replace the word "(FIG. 20)" with --(FIG. 2C)--

Column 2, line 10: Please replace the word "(FIG. 30)" with --(FIG. 3C)--

Signed and Sealed this

Twenty-fifth Day of December, 2007

JON W. DUDAS
*Director of the United States Patent and Trademark Office*